United States Patent
Chen

(10) Patent No.: US 10,180,470 B2
(45) Date of Patent: *Jan. 15, 2019

(54) SYSTEMS AND METHODS FOR IMPROVED AND EFFICIENT DETERMINATION OF THE SPECIFIC ABSORPTION RATE (SAR) IN MRI

(71) Applicant: Toshiba Medical Systems Corporation, Otawara-shi, Tochigi (JP)

(72) Inventor: Xin Chen, Beachwood, OH (US)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/874,122

(22) Filed: Jan. 18, 2018

(65) Prior Publication Data

US 2018/0156877 A1  Jun. 7, 2018

Related U.S. Application Data

(62) Division of application No. 14/573,498, filed on Dec. 17, 2014, now Pat. No. 9,910,111.

(51) Int. Cl.
  *G01V 3/00* (2006.01)
  *G01R 33/28* (2006.01)
  *G01R 33/54* (2006.01)

(52) U.S. Cl.
  CPC ......... *G01R 33/288* (2013.01); *G01R 33/543* (2013.01)

(58) Field of Classification Search
  CPC .................................................. G01R 33/288
  USPC .................................................. 324/318, 322
  See application file for complete search history.

(56) References Cited

U.S. PATENT DOCUMENTS

| | | | |
|---|---|---|---|
| 6,759,847 B2 | 7/2004 | Brinker et al. | |
| 6,762,605 B2 | 7/2004 | Brinker et al. | |
| 6,841,999 B2 | 1/2005 | Arneth et al. | |
| 7,282,914 B2 | 10/2007 | Morich et al. | |
| 9,229,074 B2 | 1/2016 | Voight | |
| 9,910,111 B2* | 3/2018 | Chen | G01R 33/543 |
| 2015/0268321 A1 | 9/2015 | Zhai | |
| 2015/0316626 A1 | 11/2015 | Thornton | |
| 2016/0178711 A1 | 6/2016 | Xen | |
| 2016/0231396 A1 | 8/2016 | Sunaga | |
| 2016/0334477 A1 | 11/2016 | Pendse | |

OTHER PUBLICATIONS

Livingston et al., "Body Surface Area Prediction in Normal-Weight and Obese Patients", Am J Physiol Endocrinol, Metab, vol. 281: E586-E591, Sep. 2001.

(Continued)

*Primary Examiner* — Louis Arana
(74) *Attorney, Agent, or Firm* — Nixon & Vanderhye P.C.

(57) ABSTRACT

Magnetic resonance imaging (MRI) systems and methods to effect improved and more efficient determination of the specific absorption rate (SAR) are described. The SAR is calculated based upon a derived relationship between a body surface area (BSA) and a portion of the total radio frequency (RF) energy delivered to RF transmit coil that is deposited in the imaging subject, and the scanning is controlled in accordance with the calculated SAR.

18 Claims, 8 Drawing Sheets

(56) References Cited

OTHER PUBLICATIONS

Haycock et al., "Geometric Method for Measuring Body Surface Area: A Height-Weight Formula Validated in Infants, Children, and Adults", Jul. 1978, The Journal of Pediatrics, pp. 62-66.

Murbach et al., "Whole-Body and Local RF Absorption in Human Models as a Function of Anatomy and Position, Within 1.5T MR Body Coil", Magnetic Resonance in Medicine (2013), pp. 1-7.

Verbraecken et al., "Body Surface Area in Normal-Weight, Overweight, and Obese Adults", Metabolism Clinical, and Experimental 55 (2006) pp. 515-524, online www.sciencedirect.com.

NEMA Standards Publication MS Aug. 2008, Characterization of the Specific Absorption Rate for Magnetic Resonance Imaging Systems.

* cited by examiner

700

|   | Landmark 1 | Landmark 2 | ... | Landmark i | ... | ... |
|---|---|---|---|---|---|---|
| $a$ | ... | ... | ... | $a_i$ | ... | ... |
| $b$ | ... | ... | ... | $b_i$ | ... | ... |

FIG. 7

SYSTEMS AND METHODS FOR IMPROVED AND EFFICIENT DETERMINATION OF THE SPECIFIC ABSORPTION RATE (SAR) IN MRI

CROSS-REFERENCE TO RELATED APPLICATIONS

This application is a divisional of U.S. patent application Ser. No. 14/573,498 filed Dec. 17, 2014 (now issued U.S. Pat. No. 9,910,11 B2), the entire contents of which are hereby incorporated by reference.

FIELD

The subject matter below relates generally to magnetic resonance imaging (MRI), and more particularly to systems and methods for improved and more efficient determination of the specific absorption rate (SAR) in MRI.

BRIEF DESCRIPTION OF THE DRAWINGS

FIG. 7 is a schematic illustration of a data structure in memory storing the relationship between the BSA and the power ratio, in accordance with one or more embodiments.

DETAILED DESCRIPTION

Figure 1:
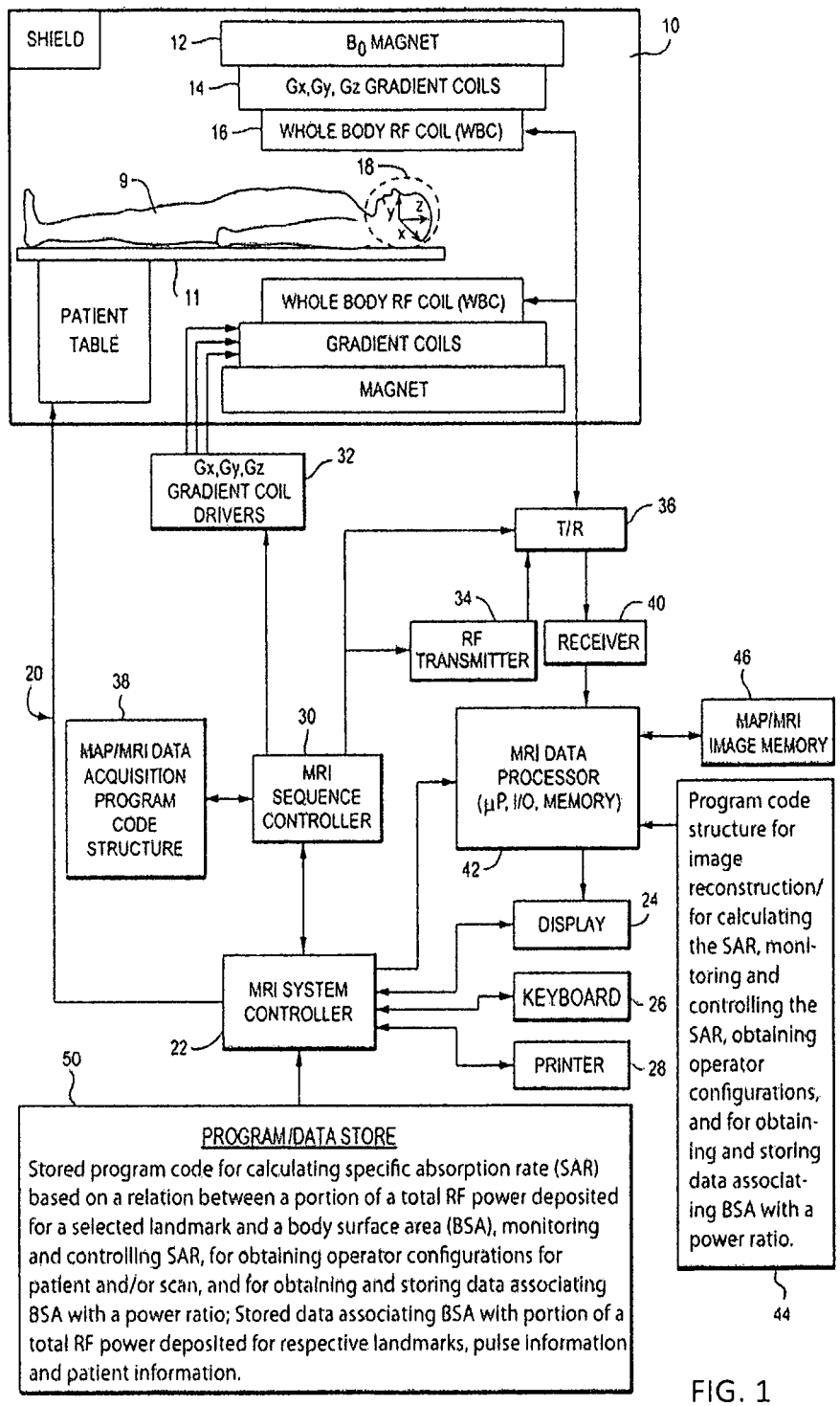
FIG. 1 is a high-level schematic block diagram of an MRI system adapted for improved and more efficient determination of the SAR in MRI scanning, in accordance with one or more embodiments.

Example embodiments of the subject matter disclosed herein provide for MR imaging with improved and more efficient determining of the specific absorption rate (SAR) during image acquisition. In embodiments, the SAR is calculated in a manner customized to each patient, so that efficiency of scanning is improved when compared to conventional techniques, while also ensuring patient safety.

MRI scanning involves the transmission of RF pulses directed at a patient's body. Typically, the RF pulses are transmitted according to a predetermined pulse sequence. Some of the RF energy of the transmitted pulses may be absorbed by the body (e.g., particularly the body's tissue). Such RF energy absorption can raise the temperature of the core (whole body) and/or localized areas in the patient's body.

Because of the resulting heating effects and potential injury risks, RF power deposition in tissue is a major safety concern for MRI scans. Therefore, the scanning process is typically controlled so as to keep the resulting temperature increase within certain limits. However, instead of directly monitoring the tissue temperature during scanning, the SAR is used in controlling the scanning process. In many implementations, prior to scanning, the pulse sequence is configured such that SAR thresholds are not exceeded, and then, during scanning, the resulting SAR is monitored to ensure that it remains at or below the one or more thresholds.

Configuration of pulse sequences may be affected by SAR thresholds. Moreover, the imaging speed (e.g. number of slices scanned per TR) is often limited by the SAR. More efficient use of SAR thresholds can therefore result in faster and more efficient scanning processes.

The SAR is defined as the absorbed power (typically in watts) per unit (typically a kilogram) of body mass. A SAR of 1 watt per kg represents an increase of temperature of an insulated slab by about 1 degree Celsius per hour. Power deposition and SAR can change significantly with various factors (patient body shape/size, imaging landmark etc.) and is difficult to generalize.

A pulse energy method as described in NEMA (National Electrical Manufacturers Association) Standards Publication MS 8-2008 is commonly used for calculating the SAR in MRI. As will be understood, there are prescribed health and safety standards that limit the SAR so as to prevent patient damage during MRI. The NEMA standard calculates power absorbed by a patient by subtracting the RF power absorbed by the RF coil ($P_{coil}$) from the total RF power ($P_{total}$) delivered to the the RF coil, the difference being divided by the patient's weight, as shown in equation (1).

$$SAR = \frac{1}{\text{weight}}(P_{total} - P_{coil}) \quad (1)$$

$P_{coil}$ varies significantly with various scan conditions.

Due to high variability of the SAR among different imaging subjects, SAR calculations on MR scanners are often configured to have excessive safety margins to protect all patients, and thus reduce imaging performance. Some conventional techniques determine SAR as a closest match with a large, pre-calculated database which covers many different scan conditions. However, because the actual subject being imaged may be substantially different from any point in the database, excessive safety margins may still be needed to account for subject variations. The excessive safety margins are relied upon to ensure that patient safety is not impaired due to SAR underestimation. Although possibly effective at reducing SAR-related injuries, such excessive safety margins reduce imaging performance and efficiency.

Several SAR monitoring and calculation techniques for conventional MR scanners are described in U.S. Pat. Nos. 6,759,847, 6,762,605, 6,841,999, 7,282,914. The U.S. Pat. No. 6,759,847 patent describes pre-measurement of a desired patient position using a pre-scan, and then using the measured patient position in the calculation of the SAR. The U.S. Pat. No. 6,762,605 patent describes a technique in which the RF power absorbed by a patient is logged over time, so that a performance history is created. This history is expanded into the future with calculated power values over time in order to predict the SAR. The U.S. Pat. No. 6,841,999 patent describes a technique in which SAR values are pre-calculated and stored for a plurality of measurement situations, and a best matching pre-stored SAR is used depending on the current scanning conditions. The U.S. Pat. No. 7,282,914 patent describes determining a power required to generate the necessary flip angles at locations from head-to-toe of the patient, and thereafter, finding the SAR value in a model that corresponds to the position of the subject being imaged and adjusting the duty cycle of the RF transmissions accordingly.

In contrast to conventional techniques, example embodiments herein determine the SAR for a particular patient based upon a relationship between the RF absorption at a particular landmark and the body surface area (BSA). This relationship between the BSA and RF absorption more accurately reflects the imaging subject's loading than in conventional techniques, and also provides for mitigating some possible operator errors.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest (i.e., region of interest or "ROI") for a patient 9 supported by a patient table 11.

In some embodiments, a smaller array RF coil (not shown) might be coupled to a portion of the patient such that the imaging volume would include the area encompassed by the smaller array RF coil. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice massage produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coil. A duty cycle or TR is also controlled by the system controller 22 and/or sequence controller 30. The transmission of pulse sequences, duty cycle etc. may be controlled by the MRI system controller 22, MRI sequence controller 30, and/or MRI data processor 42 based on, for example, program code for determining and monitoring the SAR and/or for controlling the SAR. For example, a method such as method 200 described below in relation to FIG. 2 can be performed by the MRI system controller 22, MRI sequence controller 30, and/or MRI data processor 42.

The MRI system 20 includes an RF receiver 40 providing input to data processor 42 so as to create processed image data, which is sent to display 24. The MRI data processor 42 is also configured for access to system configuration parameters 46, program code structures 44 and program/data store 50. MRI program code structures 44 and 50 may, in addition to control logic for reconstructing MRI images, also include control logic to obtain MR data from RF coils 16 and/or any other receive coils. The MRI data processor 42 may also operate to execute methods, such as, method 300 shown in FIG. 3 or parts thereof to obtain, process, and to store data associating BSA with power ratio for subsequent use in SAR determination.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for image reconstruction, for defining graphical user interfaces (GUI), accepting operator inputs to same, for SAR determinations and monitoring, for BSA determination, for controlling the MRI system based upon the SAR), and configured or predetermined data (e.g., BSA to power ratio relation tables, SAR thresholds, pulse power profiles etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of data operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Figure 2:
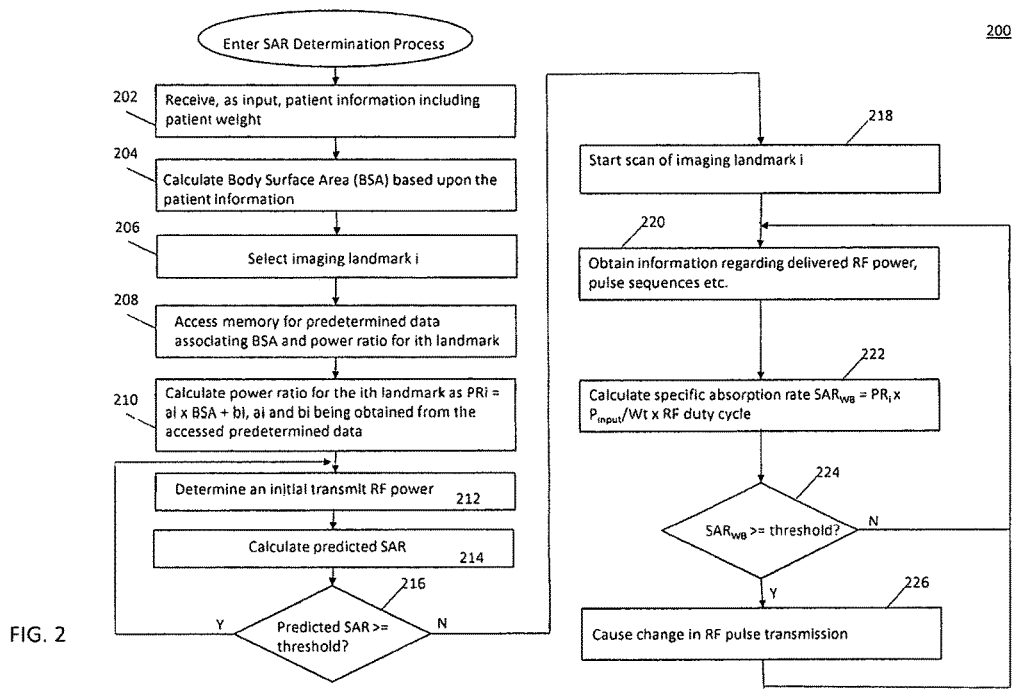
FIG. 2 illustrates a flowchart of an MRI scanning process with improved and more efficient determination of the SAR in accordance with one or more embodiments.

FIG. 2 illustrates a flowchart of a process 200 for improved and more efficient determination of the SAR during MRI scanning, according to one or more embodiments. Operations 202-226 may be performed and/or controlled by MRI data processor 42, MRI system controller 22, and/or MRI sequence controller 30 shown in FIG. 1.

After entry to the improved SAR use routine, at operation 202, information regarding the patient (e.g. patient to be subjected to MRI scanning, also referred to as imaging subject) and the MRI system are provided to the MRI system. The information regarding the patient includes patient parameters such as the weight and/or height of the patient. Typically the patient information is entered into the MRI system by the operator, but automatic transmission of at least some patient information (e.g., patient weight being automatically transmitted to the system by a weighing scale) is contemplated as embodiments.

System-related information may include a pulse sequence to be applied to the patient, and one or more anatomical landmarks to be scanned. In some embodiments, the pulse sequence is selected from a plurality of stored pulse sequences. Some embodiments provide for the user to specify the pulse sequence or to modify parts of a stored pulse sequence. The patient information and the system-related information provided and/or modified by the operator may be saved into a memory (e.g., a scanner database).

At operation 204, the BSA value is calculated based upon patient information. According to some embodiments, the BSA is calculated using both the weight and height of the patient. For example, according to one embodiment BSA is calculated as in equation (2) below:

$$BSA = 0.024265 \times W_t^{0.5378} \times H_t^{0.3964} \quad (2)$$

Equation (2) is based upon a technique described in G. B. Haycock et al., "Geometric method for measuring body surface area: A height-weight formula validated in infants, children, and adults", The Journal of Pediatrics 93:62-66 (1978). Alternatively, another technique may be used to determine the BSA from patient-related information including the patient's weight and height. Additional example techniques for calculating BSA are discussed in Verbraecken et al., "Body surface area in normal-weight, overweight, and obese adults. A comparison study", Metabolism Clinical and Experimental 55:515-524(2006), and Livingston et al., "Body surface area prediction in normal-weight and obese patients", Am J Physical Endocrinol Metab 281:E586-E591 (2001).

In some other embodiments, the BSA can be calculated without using the height. For example, a height-independent BSA formula, such as equation (3) below may be used:

$$BSA(m^2) = 0.1173 \times W_e^{0.6466} (kg) \quad (3)$$

According to equation (3), the BSA in square meters can be determined based only upon the weight of the patient expressed in kilograms. The above described techniques for determining the BSA are examples, and the use of other techniques for determining the BSA for a patient based upon patient-related information including the patient's weight and, at least in some embodiments, the patient's height are contemplated.

At operation 206, an imaging landmark for scanning is selected. A landmark (sometimes referred to as an "imaging landmark") is a part of the patient's body that is to be scanned. Examples of imaging landmarks that are frequently scanned include head, shoulder, abdomen, pelvis, knee, and feet etc. In some MRI systems some settings for a predetermined set of landmarks may be preconfigured. The predetermined settings may include a patient position and/or bed position relative to the RF transmit coil for each landmark in the preconfigured set. If only one landmark is to be scanned, then the selected landmark is the single landmark to be scanned. The landmark may be specified by the operator, or determined automatically by the system, for example, based upon the patient-position relative to the WBC, or in some embodiments another RF transmit coil. For example, the landmark closest to the center of the transmit coil may be chosen as the selected landmark. In example embodiments, a pre-scan, image analysis, and/or operator input may be used in determining the selected landmark. It should be noted that the actual patient position relative to the RF transmit coil is preferable to the bed position, because how different patients are positioned on the bed may not be consistent or sufficiently similar.

When more than one landmark is to be scanned, the system may, in sequence, choose each landmark of a desired subset of landmarks from head to toe (e.g. starting from the part of the body that first enters the scanning) as the selected landmark. Other sequences of scanning a plurality of landmarks are also contemplated as embodiments.

At operation 208, a data structure in a memory is accessed based upon the selected landmark (e.g. landmark i) and the calculated BSA. According to an embodiment, for each of a plurality of landmarks, a table or other data structure is stored in memory. The table or other data structure would include, for the corresponding landmark, information relating a BSA to a power ratio. The power ratio $PR_i$ for the landmark i, as described above, represents, for the selected landmark, the portion of the total power delivered to the RF transmit coil that is deposited into the patient. The power ratio reflects the patient's loading to the RF coil (e.g., larger patient takes more power from the coil), and shows a strong linear relationship to the BSA.

The table or other data structure may provide $a_i$ and $b_i$, corresponding to the slope and intercept, respectively, of a linear function that relates BSA to the power ratio for the selected landmark. For example, the $a_i$ and $b_i$ provided by the table or other data structure for landmark i can be such that equation (4) below is true.

$$PR_i = a_i BSA + b_i \quad (4)$$

Figure 4:
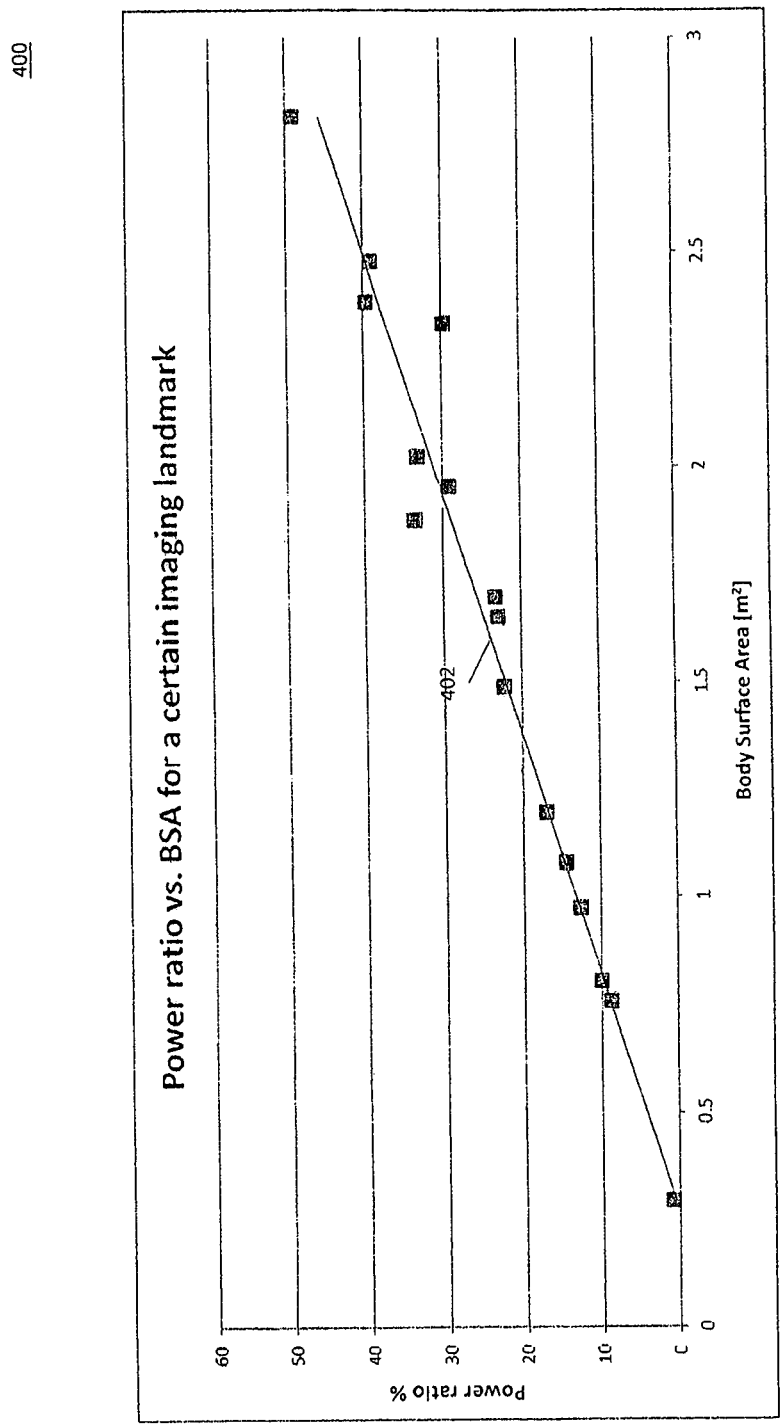
FIG. 4 illustrates a graph showing data points relating BSA to power ratio for a landmark, and an example linear fit, in accordance with one or more embodiments.
Figure 5:
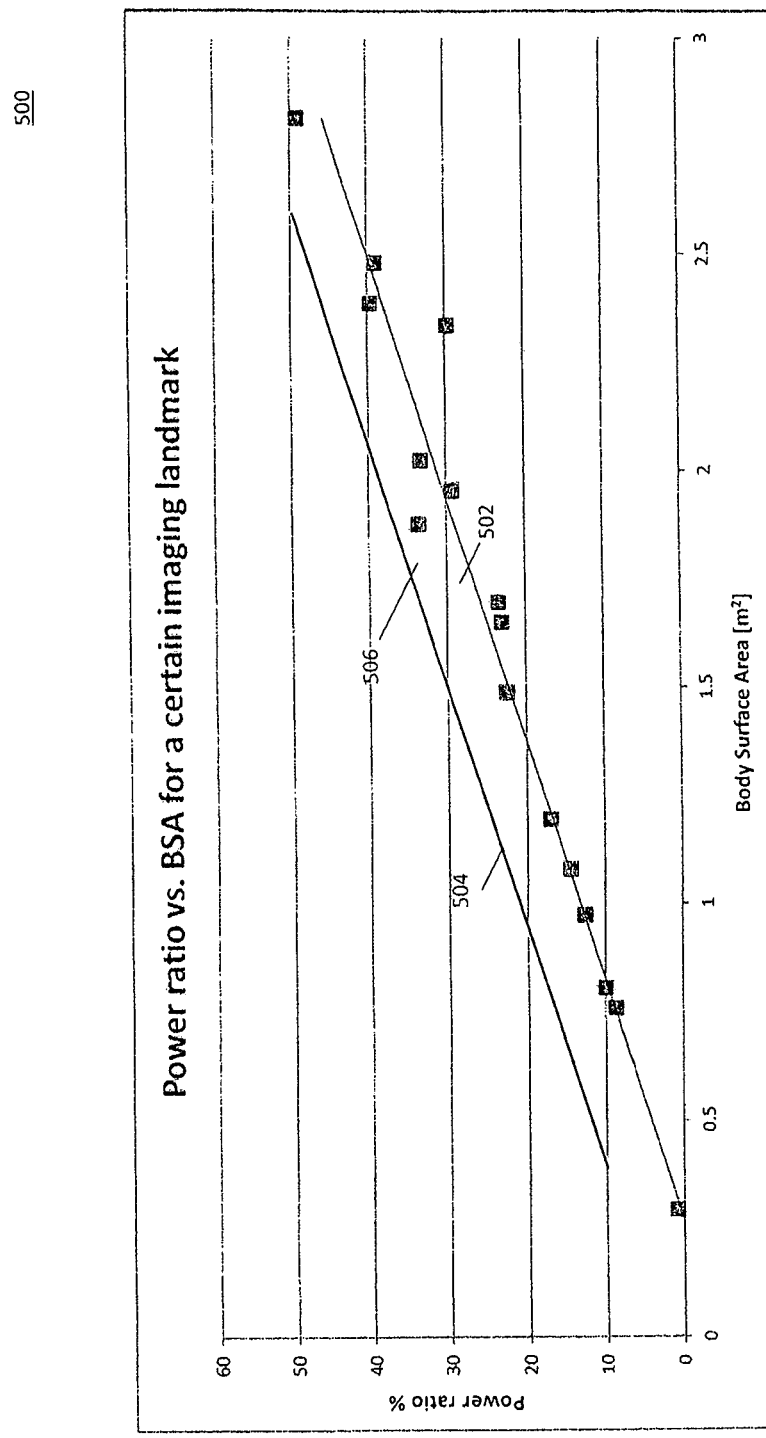
FIG. 5 illustrates the graph of FIG. 4 being enhanced with a linear relationship accounting for an error margin, in accordance with one or more embodiments.
Figure 6:
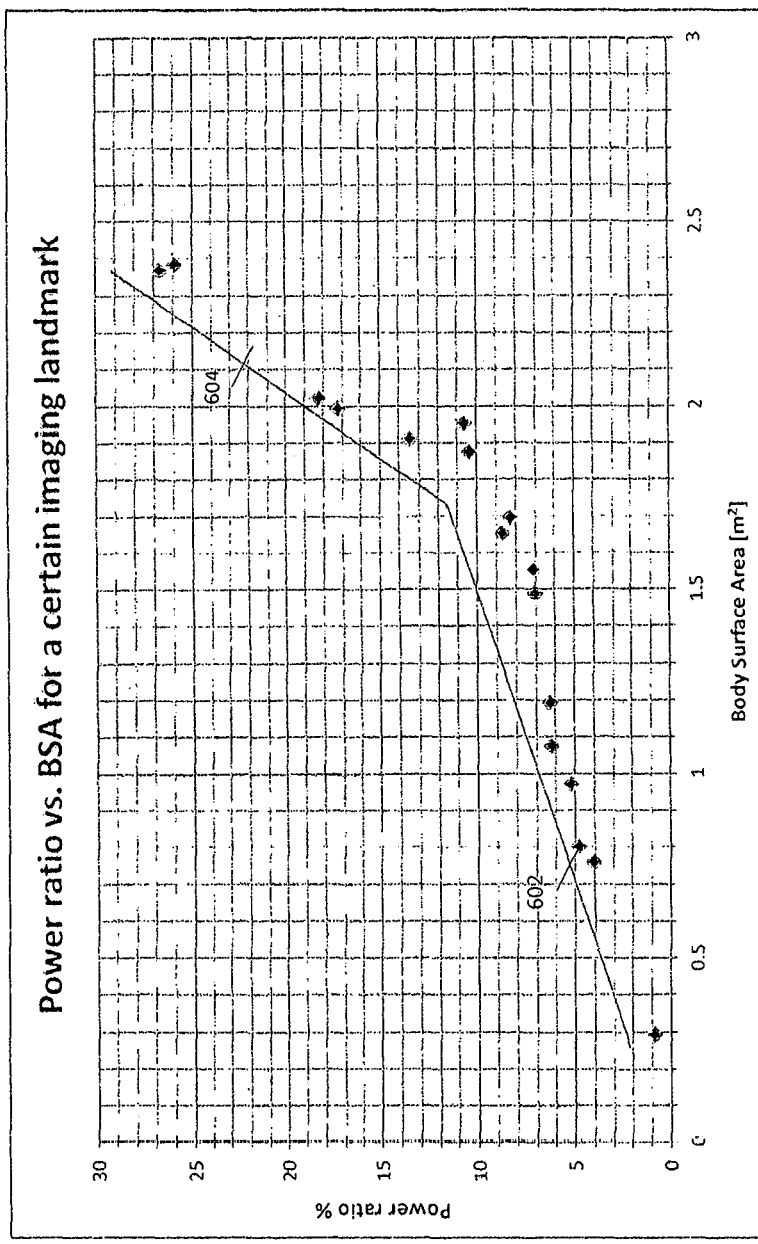
FIG. 6 illustrates a graph showing data points relating BSA to power ratio for a landmark where some of the data points are obtained by simulation and other data points are obtained by experiments, and an example piece-wise linear fit, in accordance with one or more embodiments.

An example table or other data structure 700 is described in relation to FIG. 7. FIGS. 4-6 illustrate a technique for determining the relationship between the BSA and the power ratio.

At operation 210, the power ratio (e.g. $PR_i$) is calculated for the patient and the selected landmark (e.g. landmark i), based upon the information retrieved at operation 208 from the memory. Specifically, using the $a_i$ and $b_i$ retrieved from the stored table or other data structure, and using equation (4) above, the system can determine the $PR_i$.

At operation 212, an initial SAR is determined. According to embodiments, the initial SAR is determined according to equation (5) below.

$$SAR = P_{total} \times \frac{PR_i}{W_t} \times RF \text{ duty cycle} \qquad (5)$$

In equation (5), $P_{total}$ is the total power delivered to the RF transmit coil $PR_i$ is the power ratio, or that portion of $P_{total}$ deposited into the imaging subject for the $i^{th}$ imaging landmark; $W_t$ is the weight of imaging subject (patient) typically in kg.

The RF duty cycle may be looked up from pre-stored data, calculated on the fly, or determined using a combination of pre-stored data and data calculated on the fly. According to some embodiments, for example, the individual pulse information may be pre-stored, but the pulse sequence information is determined based upon the looked up information. For example, based upon a pre-scan or other measurement, power measurements associated with certain individual pulses can be determined prior to the scan of the patient and stored to be used in calculations of the power for pulse sequences during the scanning.

The $P_{total}$ used in this operation may be an estimation, because scanning is not yet commenced so that the actual power delivered to the RF transmit coil can be determined. The $P_{total}$ estimation may be based upon the planned pulse sequences and an estimated power for each pulse.

The determined estimated $P_{total}$ is used, at operation 214, to calculate a predicted SAR using equation (5).

After calculating the predicted SAR, process 200 proceeds to operation 216. At operation 216, if, the predicted SAR calculated using equation (5) is greater than a specified SAR threshold, then the operator may be notified, and the operator may change the pulse sequence(s) and/or duty cycle etc. in order to lower the predicted SAR. After changes, the process 200 proceeds back to operation 212-216 until at operation 216, the predicted SAR is determined to be lower than the SAR threshold.

At operation 218, the scan of the patient is commenced. The scan may be according to one or more predetermined pulse sequences.

During the scan, at operation 220, information is obtained regarding the RF power transmitted from the coil. According to one embodiment, the transmitted power is determined based upon adjusting for cable loss from the power output from RF transmitter. For example, the value of the power output from the RF transmitter 34 (e.g., including RF amplifier) can be adjusted for the value of attenuation in accordance with the cable type (e.g. coaxial) and length. In other embodiments, a power meter may be used to monitor the power delivered to the RF coil.

At operation 222, the SAR for the current stage of scanning is calculated using equation (5) and the $P_{total}$ determined at operation 220.

At operation 224, it is determined whether the calculated SAR is below the specified SAR threshold.

If the SAR is above the threshold, then at operation 226, action may be initiated to stop the scanning or change system parameters such that the scanning is controlled to subsequently bring the SAR below the specified threshold. According to one embodiment, upon detecting that the SAR is above the threshold amount, the system automatically stops the scanning. The operator may then adjust the scanner parameters such that scanning can be recommenced with pulse sequence parameters that are expected to yield a lower SAR. Example adjustments may include changing the duty cycle, changing the pulse sequence, etc.

According to another embodiment, upon detecting that the SAR is above the threshold, the system notifies the operator and provides for the operator to change scanning parameters such that the operator may then adjust the scanner parameters such that SAR is lower than the threshold. If, at operation 224, it is determined that the SAR is below the threshold, then the SAR is considered within safety limits, and no changes are made to the pulse sequence(s).

For each landmark i, operations 220-226 are repeated periodically during the scanning process to ensure that the scanning is controlled in accordance with the SAR limits.

If more than one landmark is to be scanned, then for each landmark, the operations 206-226 may be repeated.

Figure 3:
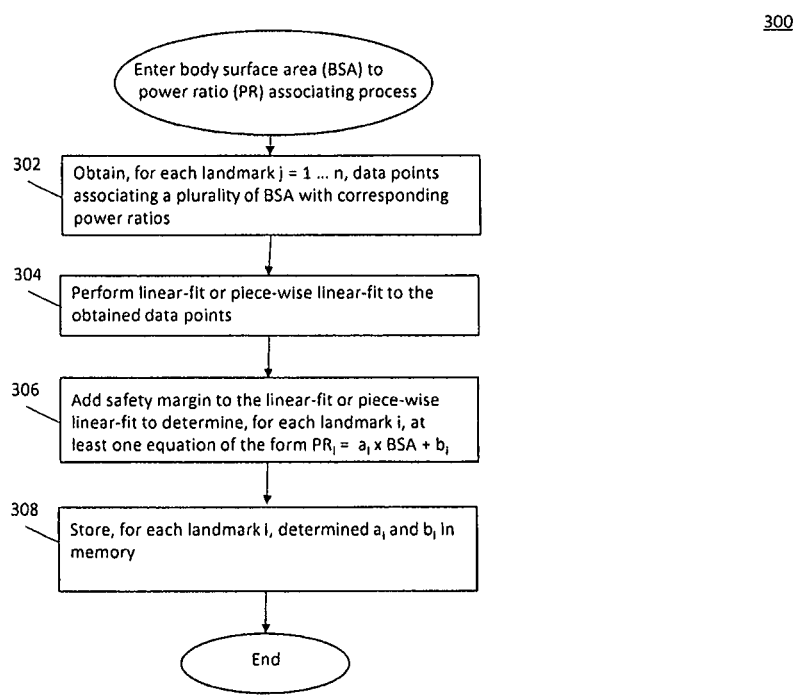
FIG. 3 illustrates a flowchart of a process for configuring information regarding the relationship between a patient's body surface area (BSA) and a power ratio in accordance with one or more embodiments.

FIG. 3 illustrates a flowchart of a process 300 for configuring the stored data associating the BSA and the power ratio. According to some embodiments, process 300 can be performed before process 200 in order to populate or create a table representing the association between BSA and power ratio. Operations 302-308 may be performed and/or controlled by MRI data processor 42 shown in FIG. 1.

After entering the process 300, at operation 302, for each landmark j=1 . . . n, the system obtains data points associating a plurality of BSA with corresponding power ratios. In some embodiments, the data points are obtained experimentally. For example, a plurality of volunteer patients may be subjected to experimental scanning to determine respective power ratios associated with each patient. For each patient, his or her weight and height information may be used to calculate an individualized BSA.

Figure 8:
FIG. 8 illustrates a schematic drawing of current sensing loop that can be used to determine the power loss of the transmit coil(s) in accordance with one or more embodiments.

The experimental data may be collected, for example, using a current sensing loop (e.g., a loop wire with 1-3 cm diameter, FIG. 8) placed in the proximity of RF coil elements. The sensing loop detects the B1 magnetic field which is proportional to current flow in the RF transmit coil of interest (e.g. WBC). The current loop may be connected to an oscilloscope outside of the MRI magnet room with a coaxial cable. A schematic drawing of the current sensing loop is shown in FIG. 8.

In order to determine the power of the coil when it is not loaded, an oil phantom can be placed at the center of the magnet, and a chosen pulse sequence performed. The forward and reflected peak power for a given RF pulse, and peak-to-peak voltages corresponding to this specific pulse can be simultaneously recorded from the oscilloscope.

In order to determine the power output by the coil when it is loaded, the oil cube can be replaced with other imaging subjects (e.g., phantoms or patients) and the measurements repeated.

When the RF transmit coil, for example, the WBC, is not loaded, the total power is equal to the coil power consumption.

$$P_{radiationloss} = P_{oil\_cube} = P_{oil\_cube}^8 \times R_{WBC} \qquad (6)$$

where $P_{oil\_cube}$ is the overall current flow on the coil and $R_{WBC}$ is the resistance including all WBC loss avenues (e.g., loss on all copper elements, cables, lumped elements and radiation loss).

When a lossy imaging subject (e.g., phantom or patient) is scanned, part of the total input power $P_{total}$ is deposited into the imaging subject ($P_{sub}$) and the rest is dissipated by the coil ($P_{coil,\,loaded}$):

$$P_{total} = P_{sub} + P_{coil,loaded} \quad (7)$$

The power ratio is then $$PR = \frac{P_{sub}}{P_{total}} \times 100\% \quad (8)$$

Since $$P_{coil,loaded} = I_{sub}^2 \times R_{WBC} = \left(\frac{I_{sub}}{I_{oil\,cube}}\right)^2 \times P_{oil\,cube},$$

and the ratio $$\frac{I_{sub}}{I_{oil\,cube}}$$

can be measured by a current sensing loop placed near coil elements, the power ratio can be determined as:

$$PR = 1 - \left(\frac{I_{sub}}{I_{oil\,cube}}\right)^2 \times \left(\frac{P_{oil\,cube}}{P_{total}}\right) = 1 - \left(\frac{V_{sub}}{V_{oil\,cube}}\right)^2 \times \left(\frac{P_{oil\,cube}}{P_{total}}\right) \quad (9)$$

where $V_{sub}$ and $V_{oil\_cube}$ are voltages recorded by the current sensing loop when imaging subject and oil cube are scanned respectively. $P_{oilcube}$ and $P_{total}$ can be calculated with forward and reflected power measured by the scanner.

According to another embodiment, the data points are determined by simulation. In yet another embodiment, some of the data points are experimentally determined, and the others are determined by simulation.

At operation 304, linear fit is performed for the data points. FIG. 4 illustrates an example chart 400 in which the data points associating BSA with the power ratio for one imaging landmark are plotted. In chart 400, the BSA is represented on the x-axis and the PR is represented on the y-axis. Each data point represents a different human subject.

In chart 400, a single best-fit line 402 can be found that is within a small distance of each of the data points. Any technique to find a best fit, such as, for example, the least squares technique, can be used. In some other embodiments, the data points may be such that a single line does not fit all the data points. In such cases, piece-wise linear fit can be performed. Piece-wise linear fit may be more accurate in relating the BSA to the power ratio for landmarks for which a wide variation exists between patients of different sizes. The line 402 and/or the corresponding linear equation of the form of equation (4) represents the linear relationship between BSA and the power ratio for the particular landmark.

The inventors have found a linear relationship between the BSA and the power ratio over numerous experimental measurements and simulations. This linear relationship between the BSA and the power ratio is consistent with the linear correlation observed by Murbach et al. between the SAR and selected anatomical features such as the BSA. See Murbach et al., "Whole-Body and Local RF Absorption in Human Models as a Function of Anatomy and Position within 1.5 T MR Body Coil", Magnetic Resonance in Medicine 71:839-845(2014).

At operation 306, a safety margin is added to the linear fits. The safety margin exists to reduce the likelihood that the SAR thresholds are exceeded during the scanning process. According to some embodiments, the safety margin is determined so as to cover the measurement error and human subject variations.

The safety-margin enhanced line can be represented as a linear equation, or set of two or more linear equations if piece-wise linear fit is performed on the data points. FIG. 5 illustrates a chart 500 in which the original linear fit line 502 (in this example, line 502 is the same as line 402) and a linear fit line 504 obtained by shifting line 502 to include a safety-margin is shown. As illustrated graphically, it is necessary to define the safety-margin enhanced line 504 to include all data points. In chart 500, for example, data point 506 which appears to be an outlier (e.g., outside a certain range relative to the majority of data points) compared to all other data points is also included when the safety-margin enhanced line 504 is defined.

The error margin that is added can be determined based upon the coil power ratio as represented in equation (9) above. For example, differentiating equation (9) yields the error in the power ratio measurements, as shown in equation (10) below.

$$\delta PR = \sqrt{\left[\left(\frac{\partial PR}{\partial V_{sub}}\right) \times \delta V_{sub}\right]^2 + \left[\left(\frac{\partial PR}{\partial V_{oil\,cube}}\right) \times \delta V_{oil\,cube}\right]^2 + \left[\left(\frac{\partial PR}{\partial P_{oil\,cube}}\right) \times \delta P_{oil\,cube}\right]^2 + \left[\left(\frac{\partial PR}{\partial P_{total}}\right) \times \delta P_{total}\right]^2}$$

$$= \left(\frac{P_{oil\,cube}}{P_{total}}\right) \times \left(\frac{V_{sub}}{V_{oil\,cube}}\right)^2 \times$$

$$\sqrt{\left(\frac{\delta P_{oil\,cube}}{P_{oil\,cube}}\right)^2 + \left(\frac{\delta P_{total}}{P_{total}}\right)^2 + 4\left(\frac{\partial V_{oil\,cube}}{V_{oil\,cube}}\right)^2 + 4\left(\frac{\partial V_{sub}}{V_{sub}}\right)^2} \quad (10)$$

FIG. 6 illustrates an example of a landmark for which the best fit for the BSA versus power ratio data points is achieved with more than one line. In the example 600 shown, a first line 602 is determined based upon a line-fit and added safety margin for lower BSA values, and a second line 604 for the data points corresponding to higher BSA values. In some embodiments, 2-3 separate line-fits over respective BSA ranges may be required in order to achieve a best fit.

Separate experiments and/or numerical electromagnetic simulations can be utilized to determine power and voltage measurement errors. As shown by equation (10), power ratio measurement error is case by case: it depends on the actual measured power and voltage values as well as power and voltage measurement errors. When experimental data is plotted, error bars can be included and used as reference for setting safety margins.

At operation 308, information associating the BSA with the power ratio are stored in a table or other data structure in a memory for each landmark. According to some embodiments, a separate table is stored for each landmark. The table stores the slope and intercept of the one or more linear equations that relate the BSA to the power ratio. In some embodiments, the information for more than one landmark may be stored together. Table 700 of FIG. 7, for example, has a plurality of columns with each column representing a respective landmark. Two rows of table 700 contains the slope and intercept values for each of the landmarks.

In some embodiments, a self-correction against operator error may be performed. For example, as noted above in relation to equation (3), the BSA may be determined using a height-independent function (e.g., equation (3)). Determining the BSA using equation (3) can, in addition to making the height value irrelevant, also reduce the impact of an incorrect weight entry by the operator. Based upon equations (3) and (5), the SAR (for example, for the WBC) can be approximated to $P_{total} \times BSA/W_t$, or considered proportional to $W_t^{-0.3534}$. Given the above, if the operator incorrectly enters twice the patient's weight as the weight, whereas many conventional systems would underestimate the SAR by 50% (e.g., see equation (1)), embodiments would underestimate by the much smaller 22%.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
    an MRI gantry having components including a static magnetic field coil, gradient magnetic field coils, at least one radio frequency (RF) coil configured to transmit RF nuclear magnetic resonance (NMR) RF excitation pulses into an imaging volume and to receive NMR RF signals from a patient located in the imaging volume; and
    one or more computer control circuits configured and connected to control said gantry components to perform operations comprising:
        determine a power ratio, based upon a body surface area (BSA) for the patient, between total power delivered to the at least one RF coil and power deposited in the patient; and
        calculate a specific absorption rate (SAR) based upon at least the determined power ratio and the total power.

2. The MRI system according to claim 1, wherein the one or more computer control circuits are further configured to:
    receive one or more input parameters including information regarding the patient, and
    calculate the BSA based upon the received one or more input parameters.

3. The MRI system according to claim 2, wherein the information regarding the patient include at least one of weight and height of the patient.

4. The MRI system according to claim 1, wherein the one or more computer control circuits are further configured to monitor the total power.

5. The MRI system according to claim 1, wherein the one or more computer control circuits are further configured to estimate the total power based upon pulse sequences during a scan of the patient.

6. The MRI system according to claim 1, wherein determining a power ratio comprises:

accessing a memory having stored therein predetermined data associating each of a plurality of BSA values with a respective corresponding power ratio; and
ascertaining, based upon the accessed predetermined data, a power ratio corresponding to the calculated BSA as the determined power ratio.

7. The MRI system according to claim 6, wherein:
the predetermined data corresponds to a derived linear relationship between the BSA values and the corresponding power ratios, and
ascertaining a power ratio is based upon the derived linear relationship.

8. The MRI system according to claim 6, wherein:
the plurality of BSA values and the corresponding power ratios include measured data from a plurality of patients.

9. The MRI system according to claim 1, wherein:
determining a power ratio is based upon the calculated BSA and a landmark, the landmark corresponding to an area, located within the imaging volume, of the patient.

10. The MRI system according to claim 9, wherein determining a power ratio further includes:
accessing a memory having stored therein, for each of a plurality of landmarks, predetermined data associating each of a plurality of BSA values with a respective corresponding power ratio for the landmark; and
ascertaining, based upon a portion of the accessed predetermined data corresponding to the landmark, a power ratio corresponding to the calculated BSA as the determined power ratio.

11. The MRI system according to claim 10, wherein:
the accessed predetermined data includes a derived linear relationship between BSA values and respective corresponding power ratios for the landmark, and
ascertaining a power ratio is based upon the derived linear relationship.

12. The MRI system according to claim 11, wherein the linear relationship incorporates a safety margin along a line fitted to a plurality of data points representing the BSA values and the corresponding power ratios.

13. The MRI system according to claim 12, wherein the linear relationship is based upon a piece-wise linear fit of the plurality of data points representing BSA values and corresponding power ratios and one or more safety margins applied to the piecewise linear fit.

14. The MRI system according to claim 11, wherein the accessed predetermined data provides a first value and a second value such that the power ratio is equal to the first value times the calculated BSA plus the second value.

15. The MRI system according to claim 1, wherein calculating the SAR is based upon the determined power ratio, the total power, and the weight of the patient.

16. The MRI system according to claim 14, wherein calculating the SAR is based upon information regarding the one or more pulse sequences.

17. A magnetic resonance imaging (MRI) method comprising:
    configuring and using an MRI system having (a) a static magnetic field coil, (b) gradient magnetic field coils, (c) at least one radio frequency (RF) coil configured to transmit nuclear magnetic resonance (NMR) RF excitation pulses into an imaging volume and to receive NMR RF signals from a patient located in the imaging volume, and (d) one or more computer control circuits to perform operations comprising:

determining a power ratio, based upon a body surface area (BSA) for the patient, between the total power delivered to the at least one RF coil and power deposited in the patient; and calculating a specific absorption rate (SAR) based upon at least the determined power ratio and the total power.

18. A system for calculating a specific absorption rate (SAR), the system comprising one or more computer control circuits configured to:

determine a power ratio, based upon a body surface area (BSA) for a patient, between total power delivered to at least one RF coil and power deposited in the patient; and calculate a SAR based upon at least the determined power ratio and the total power.

* * * * *